United States Patent [19]

Masuda

[11] Patent Number: 5,016,260
[45] Date of Patent: May 14, 1991

[54] MODULATOR AND TRANSMITTER

[75] Inventor: Youichi Masuda, Yokohama, Japan

[73] Assignee: Kabushiki Kaisha Toshiba, Kanagawa, Japan

[21] Appl. No.: 374,248

[22] Filed: Jun. 30, 1989

[30] Foreign Application Priority Data

Jul. 29, 1988 [JP] Japan ............................. 63-190377
Mar. 13, 1989 [JP] Japan ............................. 1-60162

[51] Int. Cl.$^5$ ............................................. H03C 7/00
[52] U.S. Cl. ................................. 375/66; 331/107 A; 332/102
[58] Field of Search ............... 375/65, 66; 334/727; 331/65, 179, 116, 158, 159, 161, 162, 107 A; 332/100, 101, 102; 333/193

[56] References Cited

U.S. PATENT DOCUMENTS

| | | | |
|---|---|---|---|
| 2,461,456 | 2/1949 | Usselman | 375/66 |
| 2,482,112 | 9/1949 | Johnson | 375/66 |
| 2,491,387 | 12/1949 | Miller | 375/66 |
| 3,031,527 | 4/1962 | Barton et al. | 375/66 |
| 3,271,588 | 9/1966 | Minc | 375/66 |
| 3,406,255 | 10/1968 | Lender | 375/51 |
| 3,824,491 | 7/1974 | Treadway | 331/116 R |
| 3,932,704 | 1/1976 | Bodony | 375/65 |
| 4,084,131 | 4/1978 | Matthey | 324/727 |
| 4,110,561 | 8/1978 | Guess | 371/116 M |
| 4,368,439 | 1/1983 | Shibuya et al. | 375/62 |
| 4,543,541 | 9/1985 | Norton | 331/25 |
| 4,760,351 | 7/1988 | Newell et al. | 331/65 |
| 4,856,023 | 8/1989 | Singh | 375/36 |

FOREIGN PATENT DOCUMENTS

538521 8/1941 United Kingdom.
2179480A 3/1987 United Kingdom.

OTHER PUBLICATIONS

Robinson, "A Saw Stabilized Monolithic Pulse Amplitude Modulated Microtransmitter," IEEE Transactions on Consumer Electronics, vol. CE-33, No. 3, pp. 405–412, Aug. 1987.

Mizutani et al., "An Ultrasonic Modulator for 16-Valued Frequency Shift Keying," Proceedings of 8th Symposium on Ultrasonic Electronics, Japanese Journal of Applied Physics, vol. 27, Supplement 27-1, pp. 178–180, Dec. 8–10, 1987.

Primary Examiner—Benedict V. Safourek
Assistant Examiner—Young T. Tse
Attorney, Agent, or Firm—Finnegan, Henderson, Farabow, Garrett, and Dunner

[57] ABSTRACT

A modulator includes a plurality of piezoelectric resonators, a plurality of oscillator circuits, arranged in a one-to-one correspondence with the plurality of piezoelectric resonators, for generating different frequency signals in correspondence with corresponding piezoelectric resonators, and a switching circuit for selecting a predetermined frequency signal from the plurality of different frequency signals on the basis of a value of a digital signal to be modulated, and for outputting the selected frequency signal as a modulation signal.

8 Claims, 7 Drawing Sheets

F I G. 5
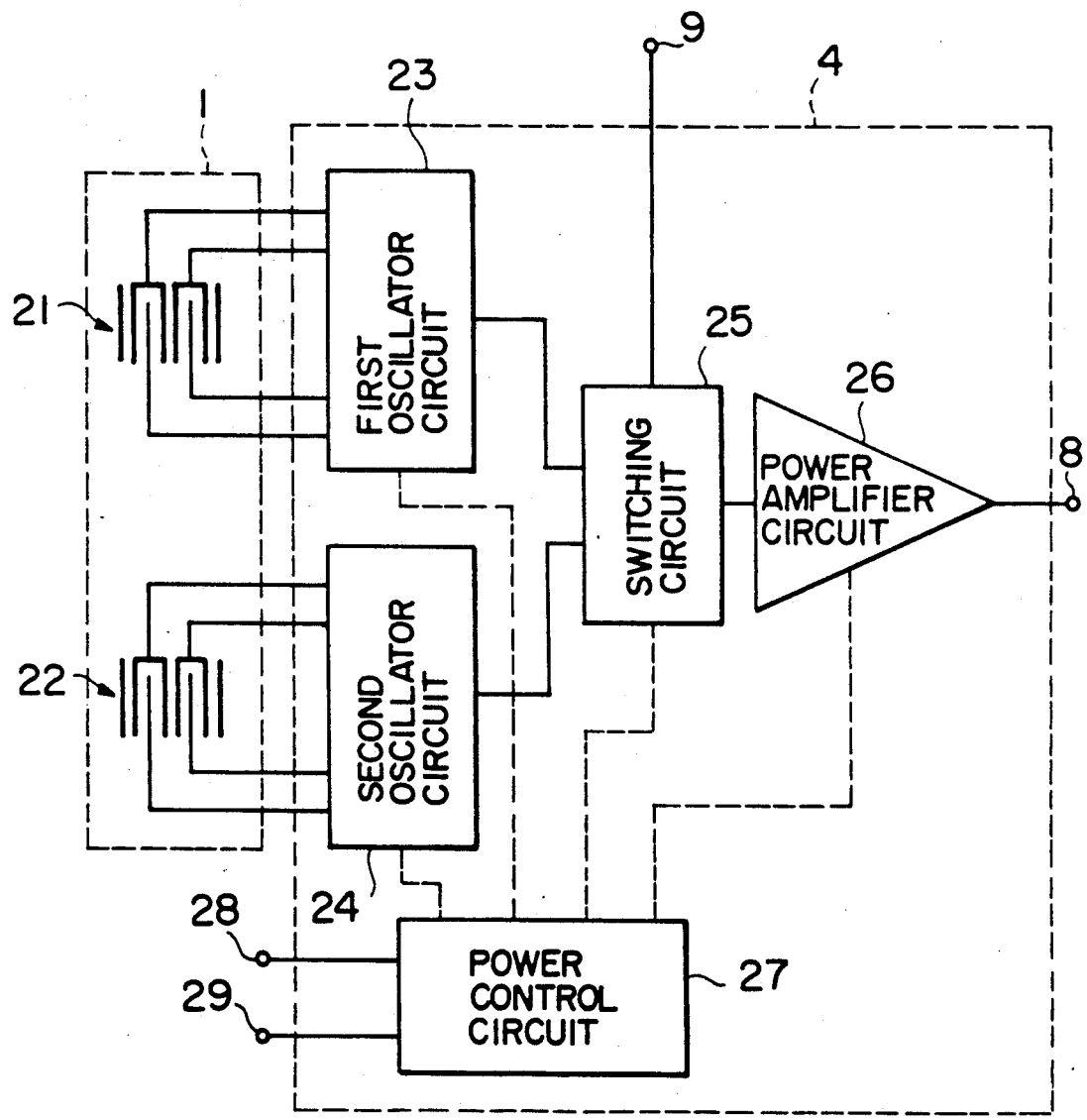

MODULATOR AND TRANSMITTER

BACKGROUND OF THE INVENTION

1. Field of the Invention

The present invention relates to a modulator used in digital communication and the like.

2. Description of the Related Art

The FSK (Frequency-Shift Keying) is known as a conventional modulation for transmitting a digital signal through a wire or as a radio signal.

The FSK is a special case of frequency modulation. When a digital modulating signal is set at logical "0", a signal having a frequency f0 is transmitted. When the signal is set at logical "1", a signal having a frequency f1 is transmitted. This modulation is advantageous in terms of a high S/N ratio upon demodulation and a simple circuit arrangement and is used in a variety of applications.

A voltage-controlled oscillator (VCO) is used as a conventional FSK modulator for obtaining an FSK signal. More specifically, a digital modulating signal is directly or after voltage conversion input to the control terminal of the voltage-controlled oscillator. When the digital modulating signal is set at logical "0", the voltage-controlled oscillator is oscillated at the frequency f0. However, when the digital modulating signal is set at logical "1", the voltage-controlled oscillator is oscillated at the frequency f1. Under these conditions, an output signal from the voltage-controlled oscillator is used as a transmission signal without processing.

An oscillator circuit which generates low phase noise must be used as the voltage-controlled oscillator to prevent generation of noise at the frequency f1 when the voltage-controlled oscillator is operated at the frequency f0 and to prevent generation of noise at the frequency f0 when the voltage-controlled oscillator is operated at the frequency f1. For this purpose, an oscillator circuit which uses a piezoelectric device such as a surface acoustic wave (SAW) device as an oscillation source is generally used as the above oscillator circuit.

In a conventional FSK modulator having the above arrangement, in order to sufficiently increase a frequency variable width of the voltage-controlled oscillator, i.e., a difference between the frequencies f0 and f1, a resonator having a small loaded Q is required. To the contrary, in order to reduce the phase noise, a resonator having a large loaded Q is required, thus presenting two contradictory requirements. In order to assure a relatively large difference between the frequencies f0 and f1, the device such as a quartz surface acoustic wave resonator having good temperature characteristics and a large loaded Q cannot be used. In addition, when the logical level of the digital modulating signal is changed from level "0" to level "1" or vice versa, the oscillation frequency of the voltage-controlled oscillator is gradually changed from the frequency f0 to the frequency f1 or from the frequency f1 to the frequency f0 by a time constant of its oscillation loop. For this reason, when a bit rate of the input digital signal is increased, a change in frequency of the voltage-controlled oscillator cannot cope with the change in frequency.

Another FSK modulator for obtaining an FSK signal is proposed wherein an output from a first oscillator oscillated at the frequency f0 and an output from a second oscillator oscillated at the frequency f1 are switched by a switching circuit in accordance with a digital modulating signal. However, this modulator has a complex circuit arrangement as compared with the FSK modulator using the voltage-controlled oscillator. It is difficult to maintain relative precision of the oscillation frequencies of the first and second oscillators without adjustment during mass production. In addition, it is difficult to prevent interference, cross modulation, and locked oscillation between oscillators when a plurality of high-frequency oscillators are arranged on a single printed circuit board or semiconductor integrated circuit substrate. Therefore, the above-mentioned FSK modulator cannot be realized in practice.

The operation characteristics of the conventional FSK modulator using the voltage-controlled oscillator depend on characteristics of a piezoelectric device used in an oscillator circuit. A difference in output frequency when the digital modulating signal is at level "0" and at level "1", and temperature characteristics of the resonator cannot be arbitrarily selected. In addition, this FSK modulator cannot be used when a bit rate of the digital modulating signal is high.

When a plurality of oscillators and a switching circuit for switching output signals from these oscillators are used, the overall circuit arrangement becomes bulky. In addition, the difference between the output frequencies cannot be maintained to be constant without adjustment during mass production, and cross modulation and locked oscillation between the oscillators occur. Therefore, it is not easy to realize a practical circuit arrangement.

SUMMARY OF THE INVENTION

The present invention has been made in consideration of the above situation, and has as its object to provide a compact FSK modulator capable of arbitrarily selecting a difference in an output frequency when a digital modulation signal is at level "1" and at level "0", maintaining the difference constant without adjustment during mass production, and being operated at a high bit rate of the digital modulating signal.

The modulator according to the present invention is characterized by comprising a plurality of piezoelectric resonators, a plurality of oscillator circuits, arranged in a one-to-one correspondence with the piezoelectric resonators, for outputting different frequency signals, and a switching circuit for selecting a predetermined one of the plurality of different frequency signals in accordance with a value of a digital signal to be modulated and for outputting the selected frequency signal as a modulating signal.

A surface acoustic wave resonator is suitable as the piezoelectric resonator.

In the modulator according to the present invention, the plurality of oscillator circuits are oscillated at different frequencies in accordance with resonant frequencies of the resonators connected thereto. One of the plurality of oscillation outputs is selected and output by the switching circuit in accordance with the value of the digital modulating signal. That is, the FSK-modulated signal by the digital modulating signal is output. Note that the switching circuit quickly responds to a change in input digital signal since it is subjected to only the switching operation.

The plurality of frequencies of the output signals can be arbitrarily set, and the difference between the frequencies can be maintained constant without adjustment during mass production. There is provided a compact FSK modulator which can be used even if the bit rate of the digital modulating signal is high, which can minimize phase noise of the output signal, and which has good temperature characteristics and high stability.

BRIEF DESCRIPTION OF THE DRAWINGS

FIG. 5 is a diagram showing an arrangement wherein the present invention is applied to a transmitter;

DESCRIPTION OF THE PREFERRED EMBODIMENTS

Preferred embodiments of the present invention will be described with reference to the accompanying drawings.

Figure 1:
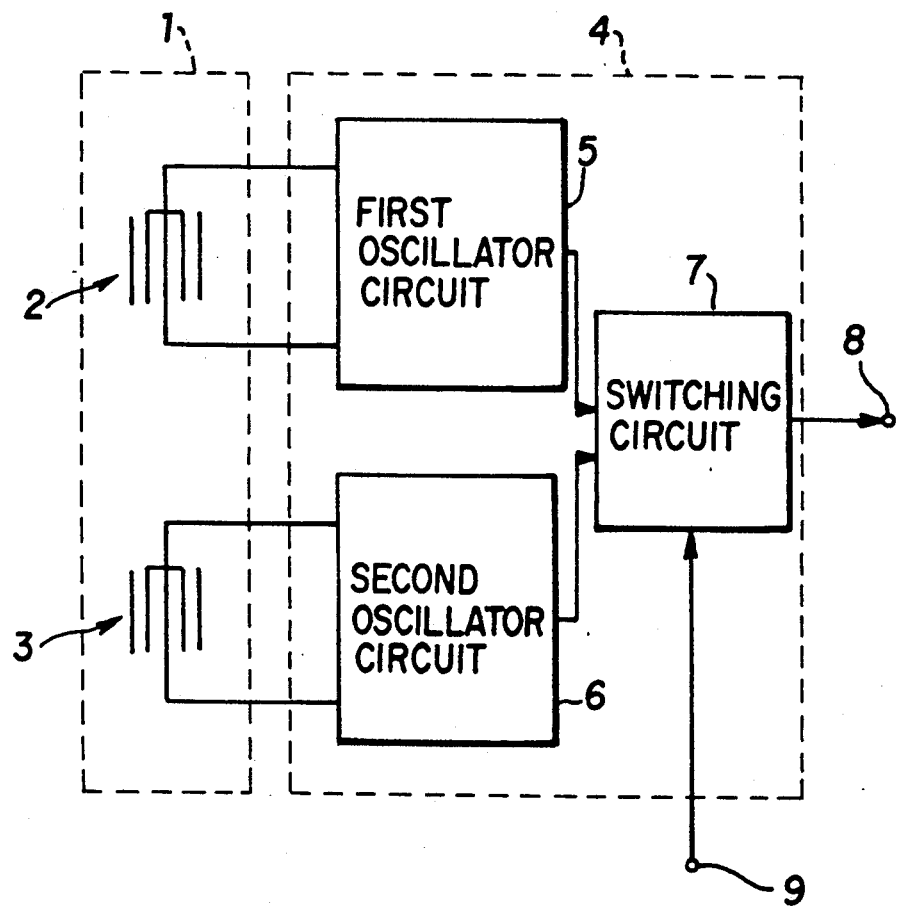
FIG. 1 is a diagram showing a circuit according to an embodiment of the present invention.

FIG. 1 is a diagram showing a circuit according to an embodiment of the present invention.

Referring to FIG. 1, a first surface acoustic wave (SAW) resonator 2 and a second surface acoustic wave resonator 3 which consist of a large number of electrode elements are formed on a piezoelectric substrate 1. The surface acoustic wave resonators 2 and 3 are respectively connected to first and second oscillator circuits 5 and 6 formed on a semiconductor integrated circuit (IC) substrate 4.

Outputs from the oscillator circuits 5 and 6 are input to a switching circuit 7 formed on the same integrated circuit substrate 4 as that of the oscillator circuits 5 and 6. An output signal from the switching circuit 7 is output from an output terminal 8. An input modulating signal is input from an input terminal 9 to the switching circuit 7. Note that voltages from a power source terminal (not shown) are supplied to the circuits 5, 6, and 7 formed on the semiconductor integrated circuit substrate 4.

In this circuit arrangement, the resonant frequencies of the first and second surface acoustic wave resonators 2 and 3 are so set as to coincide with an output signal frequency f0 required when a digital modulating signal input from the input terminal 9 is set at logical "0" and an output signal frequency f1 required when the digital modulation signal input from the input terminal 9 is set at logical "1", respectively. The resonant frequencies of the surface acoustic wave resonators 2 and 3 may be slightly offset from the actual oscillation frequencies according to the characteristics of the oscillator circuits 5 and 6. In view of this, the resonant frequencies of the surface acoustic wave resonators 2 and 3 are sometimes determined in consideration of this offset.

When the digital modulating signal input from the input terminal 9 is set at logical "0", the switching circuit 7 selects and outputs an oscillation output from the oscillator circuit 5. However, when the digital modulating signal is set at logical "1", the switching circuit 7 outputs the oscillation output from the oscillator circuit 6.

In the circuit having the arrangement of FIG. 1, the first oscillator circuit 5 is oscillated at the frequency f0 corresponding to the resonant frequency of the first surface acoustic wave resonator 2. The second oscillator circuit 6 is oscillated at the frequency f1 corresponding to the resonant frequency of the second surface acoustic wave resonator 3. When the digital modulating signal input from the input terminal 9 is set at logical "0", the signal having the oscillation frequency f0 from the first oscillator circuit 5 is output from the output terminal 8 by the switching circuit 7. When the input digital modulating signal is set at logical "1", the signal having the oscillation frequency f1 from the second oscillator circuit 6 is output from the output terminal 8 by the switching circuit 7. That is, an FSK-modulated signal by the digital modulating signal input from the input terminal 9 is output from the output terminal 8.

Note that the first and second oscillator circuits 5 and 6 are arranged by identical circuits because output levels and temperature characteristics of these circuits are set to be equal to each other.

Figure 2:
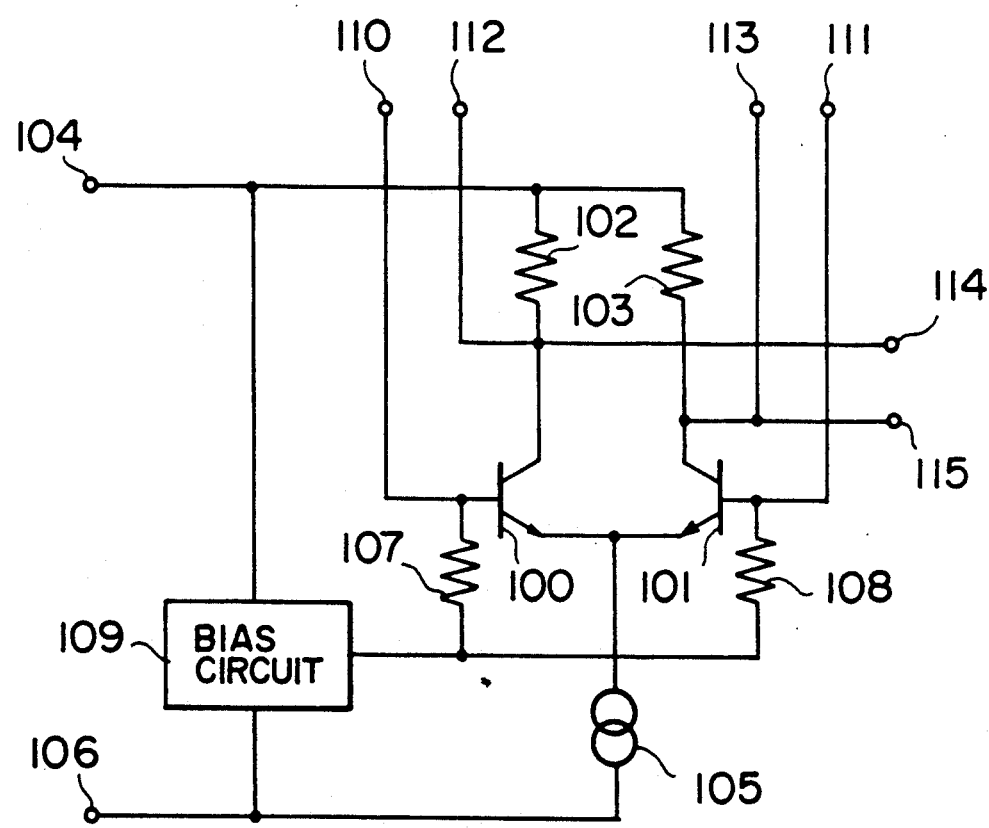
FIG. 2 is a circuit diagram showing an arrangement of an oscillator circuit shown in FIG. 1.

FIG. 2 shows a detailed circuit arrangement showing an arrangement of the first and second oscillator circuits 5 and 6.

The first and second oscillator circuits 5 and 6 are formed on a single semiconductor integrated circuit substrate. In order to minimize the interference between the oscillator circuits, the oscillator circuits of FIG. 2 constitute a differential amplifier circuit. Referring to FIG. 2, transistors 100 and 101 constitute a differential amplification transistor pair. The collectors of the transistors 100 and 101 are connected to a power source terminal 104 through resistors 102 and 103 having the same resistance, respectively. The emitters of the transistors 100 and 101 are connected to a ground terminal 106 through a common DC current source 105. The bases of the transistors 100 and 101 are connected to the output terminal of a bias circuit 109 through resistors 107 and 108 having the same resistance, respectively. Note that the bias circuit 109 is connected between the power source terminal 104 and the ground terminal 106 to generate a bias voltage.

The above circuit elements constitute the differential amplifier circuit. The bases of the transistors 100 and 101 (the inputs of the differential amplifier circuit) are respectively connected to connecting terminals 110 and 111 for the surface acoustic wave resonators. The collectors of the transistors 100 and 101 (i.e., the output of the differential amplifier circuit) are connected to connecting terminals 112 and 113 for the surface acoustic wave resonators and output terminals 114 and 115 of the oscillator circuits, respectively.

The circuit having the above arrangement serves as the oscillator circuit when the surface acoustic wave resonators 2 and 3 are connected to the connecting terminals 110, 111, 112, and 113.

When one-port surface acoustic wave resonators 2 and 3 as shown in FIG. 1 are connected, they are connected between one of the connecting terminals 110 and 111 and one of the connecting terminals 112 and 113.

In order to oscillate the above differential amplifier circuit at a frequency low enough to serve as an ideal amplifier which is almost free from a phase delay, the surface acoustic wave resonators are connected between the connecting terminals 110 and 113 or between the connecting terminal 111 and 112. In order to oscillate the differential amplifier circuit of a high frequency, it is easy to oscillate it when the one-port surface acoustic wave resonators are connected between the connecting terminals 110 and 112 or between the connecting terminals 111 and 113 because the phases of output voltages appearing at the collectors of the transistors 100 and 101 are delayed by a time constant determined by the resistors 102 and 103, a parasitic capacitance in the collector-base paths of the transistors 100 and 101, and a parasitic capacitance of the surface acoustic wave resonators.

For the sake of descriptive convenience, assume that a one-port surface acoustic wave resonator is connected between the connecting terminals 110 and 112 in the following description.

An oscillation output from this oscillator circuit is extracted as a difference between outputs from the output terminals 114 and 115 respectively connected to the collectors of the transistors 100 and 101.

A ratio of a power input from the one-port surface acoustic wave resonator to the connecting terminal 110 to a power appearing at the connecting terminal 112, that is, a power gain of the differential amplifier is set to sufficiently compensate for a loss of the one-port surface acoustic wave resonator. The power gain is determined by characteristics of the transistors 100 and 101, a current value of the DC current source 105, and resistances of the resistors 102 and 103.

In the circuit (FIG. 2) having the above arrangement, a positive feedback signal is input from the connecting terminal 112, i.e., the output of the differential amplifier circuit, to the connecting terminal 110, i.e., the input of the differential amplifier through the one-port surface acoustic wave resonator. The circuit of FIG. 2 is then oscillated, and an oscillation output appears between the output terminals 114 and 115.

At this time, the oscillation frequency is a frequency which lowers the impedance of the one-port surface acoustic wave resonator, i.e., the resonant frequency. Strictly speaking, a frequency is given such that a sum of an amount of phase shift transmitted from one end to the other end of the one-port surface acoustic wave resonator and an amount of phase shift of a voltage transmitted from the connecting terminal 110 to the connecting terminal 112 and amplified is an integer multiple of 0° or 360°.

The amount of phase shift in voltage from one end to the other end of the one-port surface acoustic wave resonator is abruptly changed to be about 180° within a narrow frequency range having the resonant frequency as its center frequency. Therefore, the circuit is oscillated at a frequency which satisfies the above condition of the sum of the amounts of phase shift within the narrow frequency range having the resonant frequency as the center frequency. When the frequency is deviated form the resonant frequency, the impedance of the one-port surface acoustic wave resonator is increased to increase the loss. Therefore, the differential amplifier circuit must have an extra gain corresponding to the loss of the one-port surface acoustic wave resonator.

In the above description, a one-port surface acoustic wave resonator is connected to the oscillator circuit shown in FIG. 2. However, a two-port surface acoustic wave resonator may be connected to this oscillator circuit. When a one-port surface acoustic wave resonator is connected, the differential amplifier circuit has only one input and one output, so the amplifier circuit cannot perform perfect differential operation. However, when a two-port surface acoustic wave resonator is connected to the oscillator circuit, the perfect differential operation can be performed.

A case wherein a two-port surface acoustic wave resonator is connected to the oscillator circuit shown in FIG. 2 will be described.

One port of the two-port surface acoustic wave resonator is connected to the connecting terminals 110 and 111, and the other port of the resonator is connected between the connecting terminals 112 and 113.

An AC voltage applied across the connecting terminals 110 and 111 of the differential amplifier circuit is amplified and appears across the connecting terminals 112 and 113. The phase of the output signal is inverted. The two-port surface acoustic wave resonator is connected to have polarities such that the voltages appearing at the two ports have inverted phases during resonance. However, when a operate at high-frequency, phases of output voltages appearing between the collectors of the transistors 100 and 101 are greatly delayed by the time constant determined by the resistors 102 and 103, a parasitic capacitance in the collector-base paths of the transistors 100 and 101, and a parasitic capacitance between the electrodes of the two-port surface acoustic wave resonator. In this case, the oscillation can be facilitated when voltages appearing at the two ports have the same phase during resonance. In order to set the voltages appearing at one port and the other port to have the same phase or opposite phases, the connecting polarity of one of the ports is inverted. In some cases, the design of the two-port surface acoustic wave resonator may be modified to shift acoustic distances of the two port by ½ the wavelength.

The oscillation output of this circuit is extracted as a difference between outputs from the output terminals 114 and 115 respectively connected to the collectors of the transistors 100 and 101.

The power gain between the input and output terminals of the differential amplifier circuit constituted by elements other than the two-port surface acoustic wave resonator, i.e, a ratio of the power output across the connecting terminals 112 and 113 to the power input across the connecting terminals 110 and 111, is set to sufficiently compensate for the loss of the two-port surface acoustic wave resonator. The ratio is determined by characteristics of the transistors 100 and 101, a current value of the DC current source 105, and resistances of the resistors 102 and 103.

In the circuit (FIG. 2) having the above arrangement, an output from the differential amplifier circuit, i.e., an output appearing across the connecting terminals 112 and 113, is positively fed back to the input of the differential amplifier circuit i.e., the connecting terminals 110 and 111 through the two-port surface acoustic wave resonator. Therefore, the oscillation output appears across the output terminals 114 and 115.

In this case, the oscillation frequency is a frequency obtained when the impedance between the ports of the two-port surface acoustic wave resonator is lowered. Strictly speaking, the frequency is given such that a sum of an amount of phase shift in voltage transmitted from one port to the other port of the two-port surface acoustic wave resonator and an amount of phase shift in voltage transmitted from the connecting terminals 110 and 111 to the connecting terminals 112 and 113 and amplified is an integer multiple of 0° or 360°.

The amount of phase shift in voltage from one port to the other port of the two-port surface acoustic wave resonator is abruptly changed to be about 180° within a narrow frequency range having the resonant frequency as its center frequency. Therefore, the circuit is oscillated at a frequency which satisfies the above condition of the sum of the amounts of phase shift within the narrow frequency range having the resonant frequency as the center frequency. When the frequency is deviated form the resonant frequency, the impedance of the two-port surface acoustic wave resonator is increased to increase the loss. Therefore, the differential amplifier circuit must have an extra gain corresponding to the loss of the two-port surface acoustic wave resonator.

An effect obtained by using the oscillator circuit shown in FIG. 2 is used in the modulator shown in FIG. 1 will be described below. A power source current flowing form the power source terminal 104 in the circuit of FIG. 2 consists of a current flowing in the bias circuit 109 and a current flowing in the DC current source 105 through the resistors 102 and 103 and the transistors 100 and 101. Therefore, the current flowing from the power source terminal 104 consist of only a DC component, and a high-frequency current having the oscillation frequency does not flow from the power source terminal 104 due to the following reason. The bias circuit 109 applies only a DC bias voltage to the transistors 100 and 101, so that only the DC current flows and a predetermined DC current flows in the DC current source 105. The transistors 100 and 101 perform a differential operation wherein the current of one transistor increases when the current of the other transistor decreases. A sum of currents flowing through the resistors 102 and 103 is always kept constant. Even if another oscillator circuit is connected to the DC power source connected between the power source terminal 104 and the ground terminal 106, the oscillator circuits do not become noise sources to each other.

Figure 3:
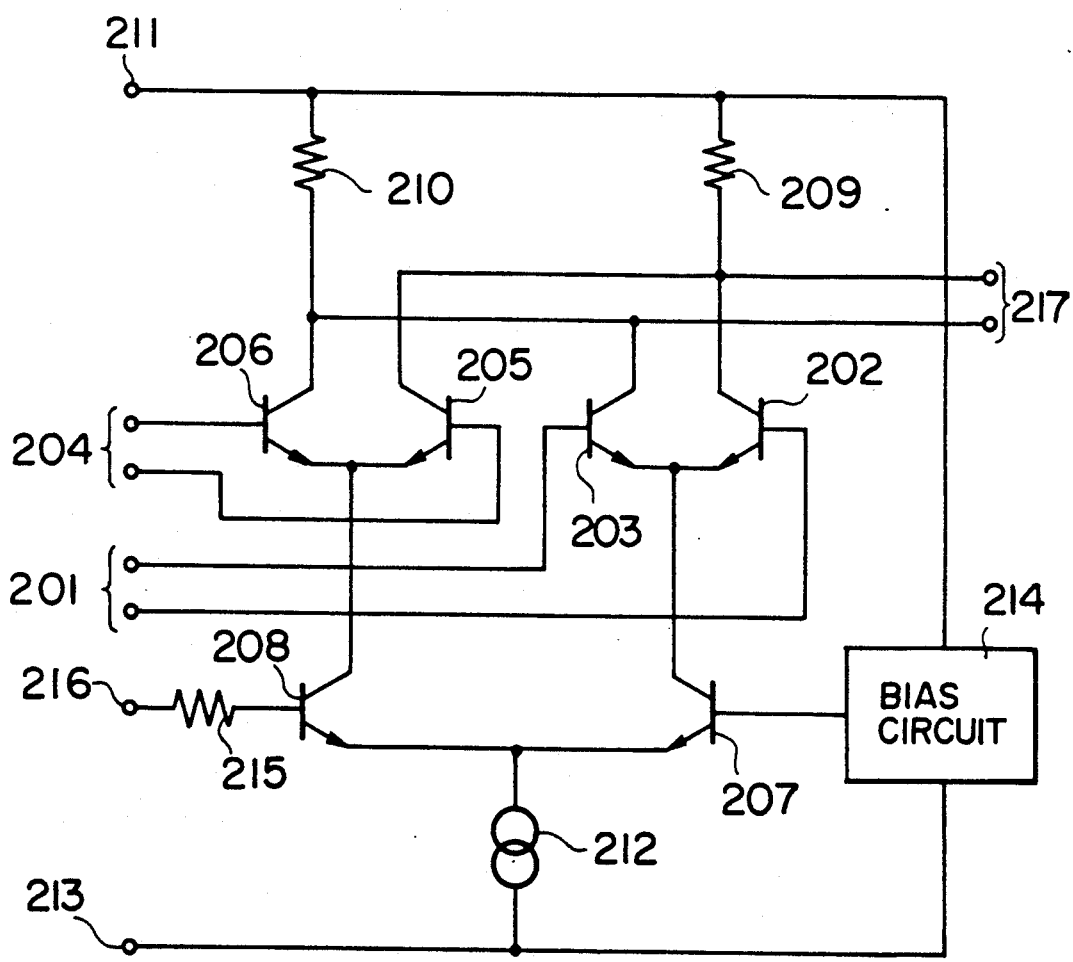
FIG. 3 is a circuit diagram showing an arrangement of a switching circuit shown in FIG. 1.

FIG. 3 is a detailed circuit diagram showing an arrangement of the switching circuit 7 in FIG. 1.

Since the integrated circuit is used, the switching circuit 7 has a differential input/output arrangement. One of first differential input terminals 201 for receiving an output from the first oscillator circuit 5 is connected to the base of a transistor 202, and the other of the first differential input terminals 201 is connected to the base of a transistor 203. One of second differential input terminals 204 for receiving an output signal from the second oscillator circuit 6 is connected to the base of a transistor 205, and the other of the second differential input terminals 204 is connected to the base of a transistor 206.

The emitters of the transistors 202 and 203 are connected to the collector of a transistor 207. The emitters of the transistors 205 and 206 are connected to the collector of a transistor 208.

The collectors of the transistors 202 and 205 are connected to a power source terminal 211 through a resistor 209. The collectors of the transistors 203 and 206 are connected to the power source terminal 211 through a resistor 210. The emitters of the transistors 207 and 208 are connected to a ground terminal 213 through a DC current source 212. A bias circuit 214 is connected to the base of the transistor 207. The base of the transistor 208 is connected to a modulation input terminal 216 through a resistor 215. The collectors of the transistors 202, 203, 205, and 206 are connected to the differential output terminals 217. Note that a DC power source is connected between the ground terminal 213 and the power source terminal 211.

In the circuit (FIG. 3) with the above arrangement, when the digital modulation signal input from the modulation input terminal 216 is set at logical "0", i.e., when the potential at the modulation input terminal 216 is sufficiently lower than a voltage applied from the bias circuit 214 to the base of the transistor 207, the transistor 208 is disabled to block the current. The current from the DC current source 212 flows through the transistor 207. In addition, the current from the DC current source 212 flows through the resistors 209 and 210 and the transistors 202 and 203. For this reason, a signal input terminal 201 is differentially amplified by the transistors 202 and 203 and appears at an output terminal 217. However, since a current does not flow in the transistor 208, the current does not flow in the transistors 205 and 206, either. The transistors 205 and 206 do not serve as amplifier elements, and the signal input to the differential input terminal 204 isn't amplified. Therefore, the signal input from the differential input terminal 201, i.e., only the output signal from the first oscillator circuit 5 is amplified. The amplified signal appears at the differential output terminal 217.

When the digital modulation signal is set at logical "1", i.e., when the potential at the modulation input terminal 216 is sufficiently higher than the voltage applied from the bias circuit 214 to the base of the transistor 207, the transistor 207 is disabled, and a current does flow therethrough. The current from the DC current source 212 flows through the transistors 208. In addition, the current flows from the DC current source 212 flows through the resistors 209 and 210 and the transistors 205 and 206. Therefore, the signal input from the differential input terminal 204 is differentially amplified by the transistors 205 and 206, and the amplified signal appears at the differential output terminal 217. However, since a current does flow in the transistor 207, currents do not flow in the transistors 202 and 203, either. The transistors 202 and 203 do not serve as amplifier elements, and the signal input from the differential input terminal 201 is not amplified. Therefore, the signal input from the differential input terminal 204, i.e., only the output signal from the second oscillator circuit 6 is amplified. The amplified signal is output from the differential output terminal 217.

As described above, in the switching circuit shown in FIG. 3, when the digital modulating signal is set at logical "0", the signal input from the differential input terminal 201 is amplified, and the amplified signal is output. However, when the digital modulating signal is set at logical "1", the signal input from the differential input terminal 204 is amplified, and the amplified signal is output. Since a capacitor and a resistor having a high resistance which increase a time constant are not included in the switching circuit, the circuit can be operated at high speed.

The transistors 202 and 203, and the transistors 205 and 206 in FIG. 3 serve as differential amplifiers, respectively. Even if noise is applied between the ground terminal 213 and the power source terminal 211, or between the input terminals 201 and 204, the input noise can be eliminated and is not output from the differential output terminal 217. A current flowing from the power source connected between the ground terminal 213 and the power source terminal 212 to the switching circuit consists of only a current flowing in the bias current 214 and a current flowing through the DC current source 212. Therefore, only the DC current flows in the switching circuit. The switching circuit shown in FIG. 3 does not become a noise source for other circuits (e.g., an oscillator circuit) connected to the power source.

The switching circuit shown in FIG. 3 is suitable for an integrated circuit due to the above reasons.

The effect of the embodiment shown in FIG. 1 will be described below. The switching circuit 7 shown in FIG. 1 simply selects one of the outputs from the oscillator circuits 5 and 6 and outputs the selected signal. For this reason, the switching circuit can be operated at high speed and can easily cope with a change in digital modulating signal input from the input terminal 9. Therefore, even if the bit rate of the digital modulating signal is high, no problem is posed.

The frequency f0 of the output signal obtained when the digital modulating signal is at logical "0" and the frequency f1 of the output signal obtained when the digital modulating signal is at logical "1" can be independently determined by the surface acoustic wave resonators 2 and 3, respectively. For this reason, the frequencies f0 and f1 can be set independently of the loaded Qs of the surface acoustic wave resonators 2 and 3. Resonators having large loaded Qs and excellent temperature characteristics can be used as the surface acoustic wave resonators 2 and 3. Therefore, a stable FSK signal source having low phase noise can be obtained.

Furthermore, since the surface acoustic wave resonators 2 and 3 are formed on the single piezoelectric substrate 1, variations in resonant frequencies of the resonators during mass production equally occur in both the resonators 2 and 3. More specifically, when the resonant frequency of one resonator is decreased, the resonant frequency of the other resonator is decreased accordingly, and vice versa. Similarly, since the oscillator circuits 5 and 6 are formed on the single semiconductor substrate 4, characteristic variations between them are small. Therefore, the difference between the frequencies f0 and f1 can be maintained constant without adjustment even during mass production.

The embodiment shown in FIG. 1 can be realized by two chips, i.e., a chip of the piezoelectric substrate 1, and a chip of the semiconductor integrated circuit substrate 4. The package of the resultant circuit arrangement can be made compact.

The present invention is not limited to the particular embodiment described above. Various changes and modifications may be made within the spirit and scope of the invention.

Figure 4:
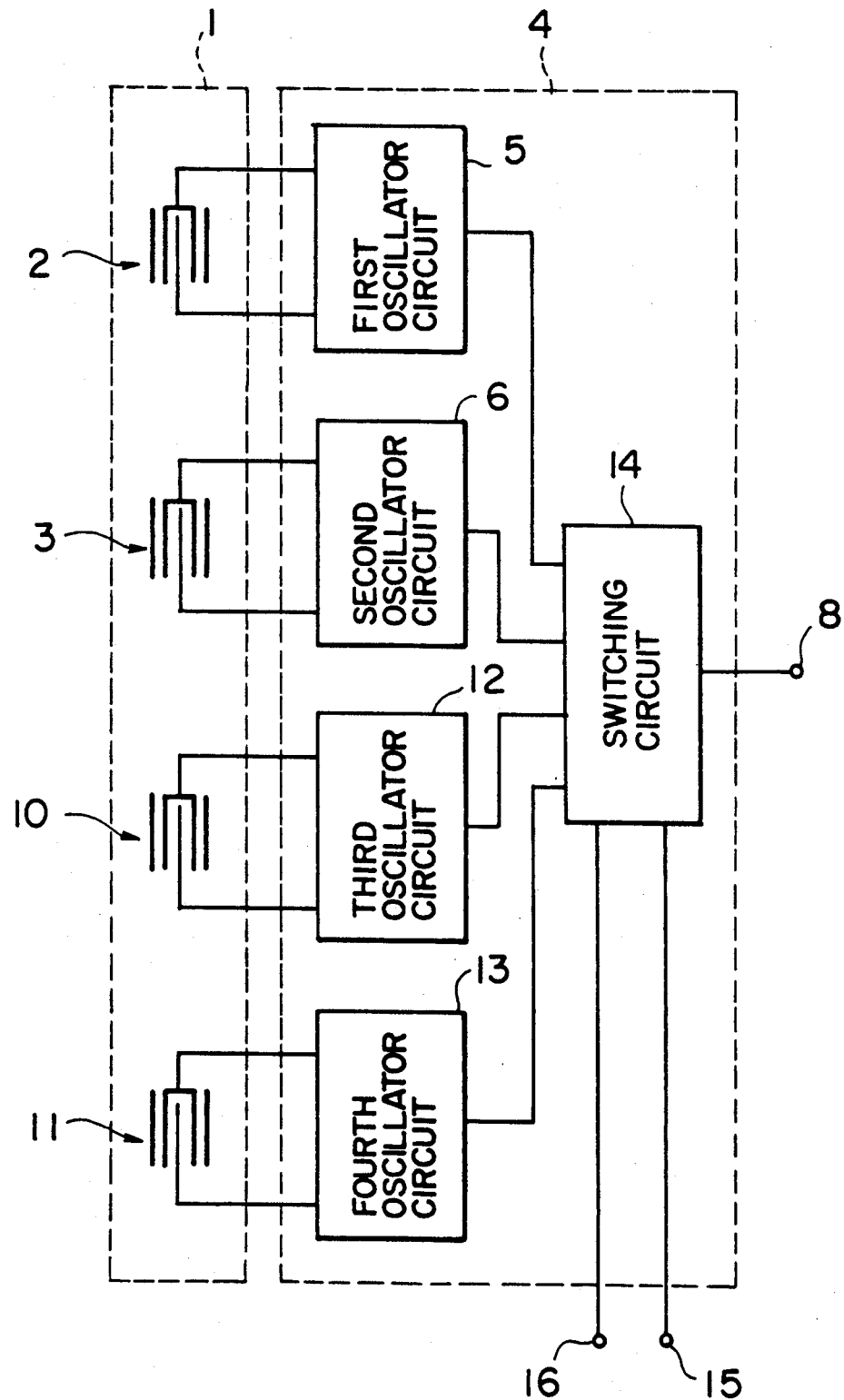
FIG. 4 is a diagram showing a circuit according to another embodiment of the present invention.

FIG. 4 is a diagram showing a circuit according to another embodiment of the present invention. The same reference numerals as in the first embodiment denote the same parts in the second embodiment, and a detailed description thereof will be omitted.

First, second, third, and fourth surface acoustic wave resonators 2, 3, 10, and 11 are formed on a piezoelectric substrate 1, and are connected to first, second, third, and fourth oscillator circuits 5, 6, 12, and 13 formed on a semiconductor integrated circuit substrate 4, respectively. Output signals from the oscillator circuits 5, 6, 12, and 13 are input to a switching circuit 14 formed on the integrated circuit substrate 4. An output signal from the switching circuit 14 appears at an output terminal 8. A 2-bit modulation input signal is input from input terminals 15 and 16 to the switching circuit 14. Note that a voltage is applied from a power source terminal (not shown) to each of the above circuits.

In the circuit (FIG. 4) having the above arrangement, when a two-bit digital modulating signal input from the input terminals 15 and 16 is set to be "00", a signal having an oscillation frequency f0 from the first oscillator circuit 5 appears at the output terminal 8. However, when the two-bit digital modulating signal is set to be "01", a signal having an oscillation frequency f1 from the second oscillator circuit 6 appears at the output terminal 8. When the two-bit digital modulating signal is set to be "10", a signal having an oscillation frequency f2 from the third oscillator circuit 12 appears at the output terminal 8. When the two-bit digital modulating signal is set to be "11", a signal having an oscillation frequency f3 from the fourth oscillator circuit 13 appears at the output terminal 8. That is, four-value FSK modulation by using the two-bit digital modulating signal input from the input terminals 15 and 16 can be performed. Other circuit operations of the second embodiment are the same as those of the first embodiment shown in FIG. 1. Substantially the same effect as in the first embodiment can be obtained in the second embodiment.

Similarly, FSK modulation of three values or five or more values may be achieved.

According to the present invention, a high-performance FSK modulator as described above can be arranged. A transmitter using FSK modulation according to still another embodiment of the present invention can be arranged.

FIG. 5 is a diagram showing an FSK modulator serving as a transmitter.

Referring to FIG. 5, first and second two-port surface acoustic wave resonators 21 and 22 are formed on a piezoelectric substrate 1 and are connected to first and second oscillator circuits 23 and 24 formed on a semiconductor integrated circuit substrate 4, respectively.

Outputs from the oscillator circuits 23 and 24 are input to a switching circuit 25 formed on the same semiconductor integrated circuit substrate 4 as that of the oscillator circuits 23 and 24. An output signal from the switching circuit 25 is amplified by a power amplifier circuit 26, and the amplified signal is output to an output terminal 8. A modulation input signal is input from an input terminal 9 to the switching circuit 25.

The oscillator circuits 23 and 24, the switching circuit 25, and the power amplifier circuit 26 have a function for simultaneously varying power consumption and an output signal level. Output signals from a power control circuit 27 formed on the semiconductor integrated circuit substrate 4 are respectively input to the control terminals, i.e., power control terminals of these circuits. The power control circuit 27 has two inputs: one input is used to set current consumption and the output levels of all circuits formed on the semiconductor integrated circuit substrate 4 and is connected to an input terminal 28; and the other input is used to enable or disable all the circuits formed on the semiconductor integrated circuit substrate 4 and is connected to an input terminal 29. Note that a voltage is applied from a power source terminal (not shown) to the circuits 23, 24, 25, 26, and 27 formed on the semiconductor integrated circuit substrate 4.

For the sake of descriptive convenience, assume that a signal for operating all the circuits, e.g., a digital signal of logical "1" is input to the input terminal 29, a power setting resistor is connected between the input terminal 28 and a power source (not shown), and all the circuits are operated with predetermined current consumption. Also assume that an antenna is connected to the output terminal 8 through a matching circuit (not shown).

The antenna may be directly connected to the output terminal 8 through the matching circuit.

The piezoelectric substrate 1 and the semiconductor integrated circuit substrate 4 of FIG. 5 are mounted in a single package.

A resonant frequency of the first two-port surface acoustic wave resonator 21 and a resonant frequency of the second two-port surface acoustic wave resonator 22 are so set as to coincide with an output signal frequency f0 required when the digital modulating signal input from the input terminal 9 is at logical "0" and an output signal frequency f1 required when the digital modulating signal is at logical "1", respectively. The resonant frequencies of the surface acoustic wave resonators 21 and 22 may be slightly deviated from the actual oscillation frequencies due to the characteristics of the oscillator circuits 23 and 24. The resonant frequencies of the surface acoustic wave resonators 21 and 22 are designed in consideration of the above deviation in some cases.

When the digital modulating signal input from the input terminal 9 is set at logical "0", the switching circuit 25 selects an oscillation output from the oscillator circuit 23. However, when the signal is set at logical "1", the switching circuit 25 selects an oscillation output from the oscillator circuit 24.

In the circuit (FIG. 5) having the above arrangement, the first oscillator circuit 23 is oscillated at the frequency f0 corresponding to the resonant frequency of the first two-port surface acoustic wave resonator 21. The second oscillator circuit 24 is oscillated at the frequency f1 corresponding to the resonant frequency of the second two-port surface acoustic wave resonator 22. When the digital modulating signal input from the input terminal 9 to the switching circuit 25 is set at logical "0", the signal of the oscillation frequency f0 from the first oscillator circuit 23 is output. However, when the digital modulating signal is set at logical "1", the signal of the oscillation frequency f1 from the second oscillator circuit 24 is output. That is, an FSK-modulated signal by the digital modulating signal input from the input terminal 9 is output from the switching circuit 25.

The FSK-modulated signal is amplified by the power amplifier circuit 26 and radiated as a radio wave from an antenna connected to the output terminal 8 through the matching circuit.

The first and second oscillator circuits 23 and 24 can be constituted by identical circuits in the same manner as in the first embodiment.

Figure 6:
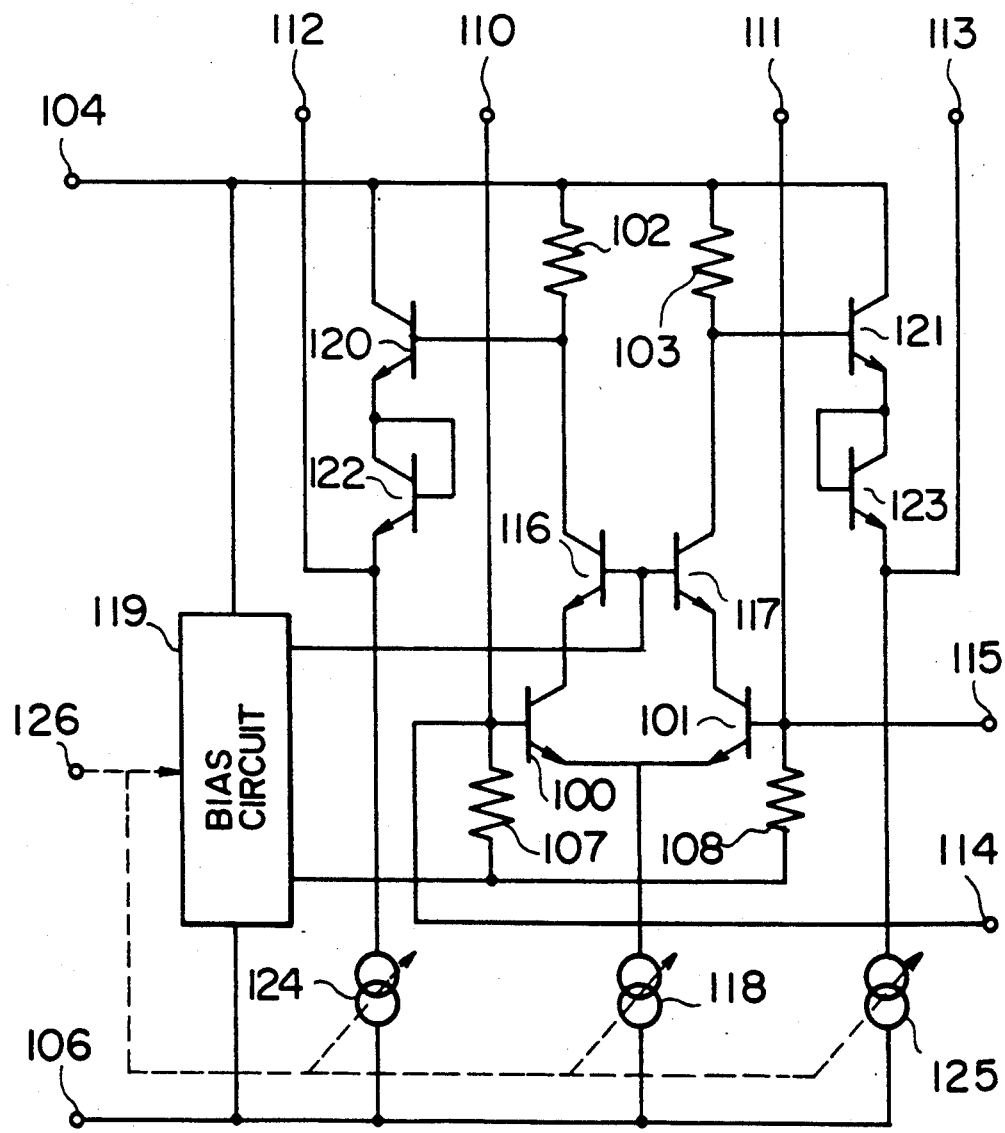
FIG. 6 is a circuit diagram showing an arrangement of an oscillator circuit shown in FIG. 5.

FIG. 6 is a circuit diagram showing an arrangement of the first and second oscillator circuits 23 and 24.

The oscillator circuit shown in FIG. 6 is a modification of the oscillator circuit of FIG. 2 and is constituted by a differential amplifier arrangement in the same manner as in FIG. 2.

Referring to FIG. 6, transistors 100 and 101 constitute a differential amplification transistor pair. The collectors of the transistors 100 and 101 are connected to a power source terminal 104 through the collector-emitter paths of transistors 116 and 117 and resistors 102 and 103 having the same resistance. The emitters of the transistors 100 and 101 are connected to a ground terminal 106 through a common DC current source 118. The bases of the transistors 100 and 101 are connected to one output of a bias circuit 119 through resistors 107 and 108 having the same resistance.

The bases of transistors 116 and 117 are directly connected to the other output of the bias circuit 119. The bases of transistors 120 and 121, the collectors of which are connected to the power source terminal 104, are connected to the collectors of the transistors 116 and 117, respectively.

The emitters of the transistors 120 and 121 are connected to the ground terminal 106 through the collector-emitter paths of transistors 122 and 123 and DC current sources 124 and 125. The bases of the transistors 122 and 123 are connected to the collectors thereof, so that the transistors 122 and 123 serve as diodes. The DC current sources 118, 124, and 125 have a function for varying their current values, and their control terminals are connected to the power control terminal 126. The bias circuit 119 is connected to the power source terminal 104 and the ground terminal 106 to constitute a power source and has a function for varying current consumption. The control terminal of the bias circuit 119 is connected to the power control terminal 126.

The above circuits constitute a differential amplifier circuit. The bases of the transistors 100 and 101 (i.e., the input of the differential amplifier circuit) are connected to connecting terminals 110 and 111 for the surface acoustic wave resonators. The emitters of the transistors 122 and 123 (i.e., the output of the differential amplifier circuit) are connected to connecting terminals 112 and 113 for the surface acoustic wave resonators, respectively. Outputs from the oscillator circuits are obtained from output terminals 114 and 115 respectively connected to the bases of the transistors 100 and 101.

For the sake of descriptive convenience, assume that a control signal from the power control circuit 27 of FIG. 5 is applied to the power control terminal 126, current consumption of the DC current sources 118, 124, and 125 is regulated to be a predetermined value, and the DC current sources are operated under this condition.

The circuit (FIG. 6) having the arrangement described above can be operated as an oscillator circuit when one- or two-port surface acoustic wave resonators are connected to the connecting terminals 110, 111, 112, and 113. A method of connecting the surface acoustic wave resonators and their operation are the same as those in FIG. 2, and a detailed description thereof will be omitted. Only differences will be described below.

The collector potentials of the transistors 100 and 101 serving as the differential amplification pair are set at values obtained by subtracting base-emitter voltages (i.e., about 0.7 V) of the transistors 116 and 117 from the voltages applied from the bias circuit 119 to the bases of the transistors 116 and 117. Therefore, the collector potentials of the transistors 100 and 101 are kept substantially constant even in the oscillation state. In particular, the collector AC voltage which poses a problem in the case of a high-frequency arrangement is negatively fed back by the parasitic capacitance of the collector-base paths of the transistors 100 and 101. But as the collector potentials of the transistors 100 and 101 are kept substantially constant even in the oscillation state, the gains of the transistors 100 and 101 are thus equivalently reduced.

Collector currents of the transistors 100 and 101 flow through the resistors 102 and 103 and the collector-emitter paths of the transistors 116 and 117. AC signals input from the connecting terminals 110 and 111 are amplified, and the amplified signals are input to the bases of the transistors 120 and 121.

A circuit consisting of the transistors 120 and 122 and the DC current source 124 and a circuit consisting of the transistors 121 and 123 and the DC current source 125 serve as so-called emitter follower buffer amplifiers, respectively. The AC voltages applied to the bases of the transistors 120 and 121 are output form the connecting terminals 112 and 113 through the emitter follower buffer amplifiers, respectively. Since the signals are output through the buffer amplifiers, the circuit of FIG. 6 is not adversely affected by the impedances of the surface acoustic wave resonators, thereby obtaining a stable signal. An output from the oscillator circuit is obtained by the base of each of the transistors 100 and 101. However, this output may be obtained from the collector of each of the transistors 116 and 117 or the emitter of each of the transistors 122 and 123.

In the oscillator circuit of FIG. 6, a current flowing from the power source connected between the power source terminal 104 and the ground terminal 106 entirely flows through the DC current sources 118, 124, and 125, and the bias circuit 119. The current values of the DC current sources 118, 124, and 125 and the current consumption of the bias circuit 119 can be adjusted by a signal applied to the power control terminal 126. That is, the current consumption of the entire circuit can be controlled by the signal applied to the power control terminal 126. In some cases, the current consumption of the entire circuit can be set to be zero to stop the circuit operation, i.e., the circuit can be set in the standby state. When the current values of the DC current sources 118, 124, and 125 are changed, values of currents flowing through the transistors are changed accordingly, so that the gain of the differential amplifier circuit is also changed. Therefore, the level of the oscillation output from the output terminals 114 and 115 can also be controlled by the signal applied to the power control terminal 126 in addition to the current consumption of the entire circuit.

An effect obtained by using the oscillator circuit of FIG. 6 as the transmitter of FIG. 5 will be described below. Referring to FIG. 6, a current flowing from the power source connected between the power source terminal 104 and the ground terminal 106 to the circuit of FIG. 6 entirely flows through the DC current sources 118, 124, and 125 and the bias circuit 119. Therefore, the current flowing from the power source consists of only a DC current and does not include a high-frequency current. For this reason, even if another oscillator circuit is connected to the power source, the oscillator circuits do not serve as noise sources to each other.

As another effect, the current consumption of the entire circuit and the oscillation output level can be controlled.

In the above description, the oscillator circuits of FIG. 6 are exemplified as the first and second oscillator circuits of FIG. 5.

Figure 7:
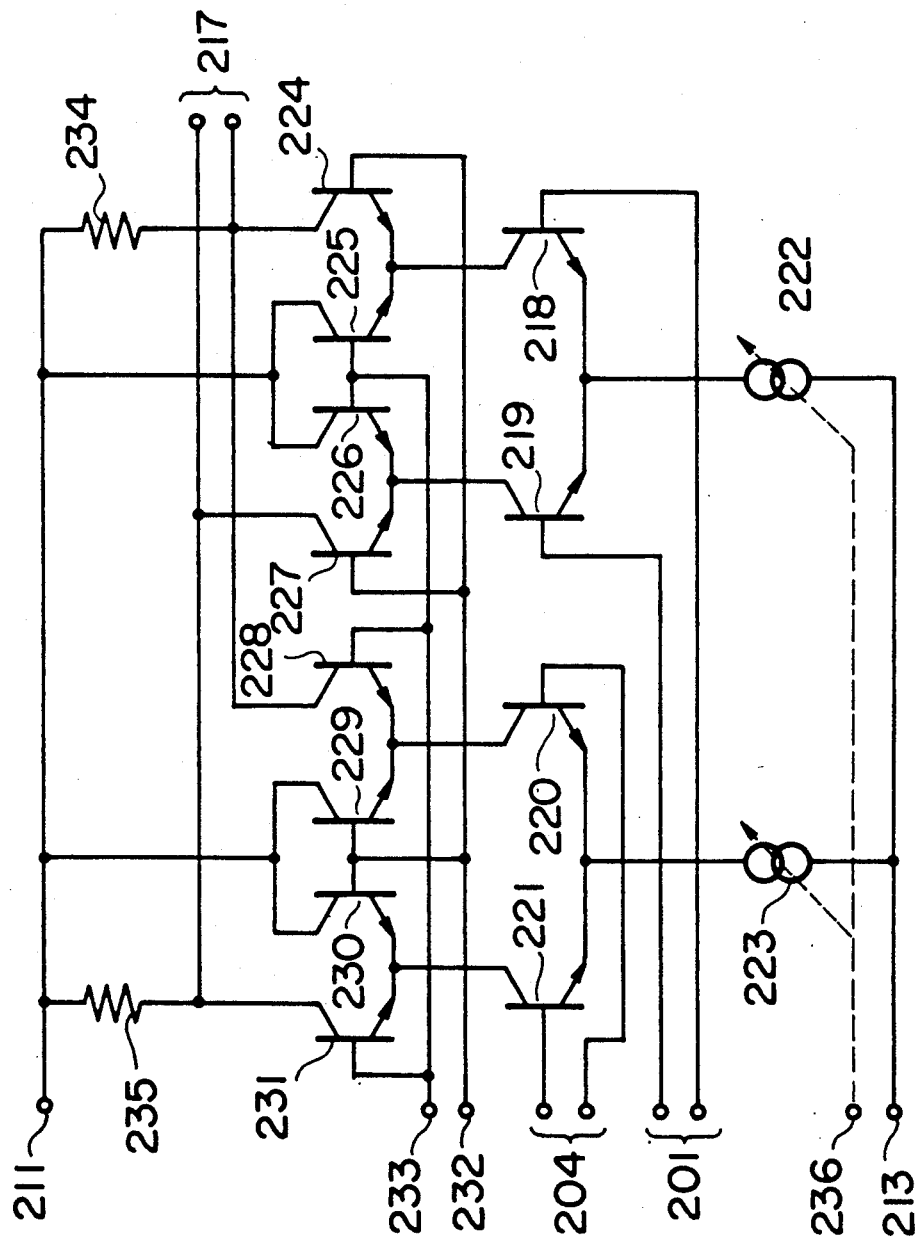
FIG. 7 is a circuit diagram showing an arrangement of a switching circuit shown in FIG. 5.

FIG. 7 is a detailed circuit diagram showing an arrangement of the switching circuit 25 shown in FIG. 5.

Since an integrated circuit is used, the switching circuit 25 has a differential input/output arrangement.

One of first differential input terminals 201 for receiving output signal from the first oscillator circuit 23 is connected to the base of a transistor 218, and the other of the first differential input terminals 201 is connected to the base of a transistor 219. One of second differential input terminals 204 for receiving the output signal from the second oscillator circuit 24 is connected to the base of a transistor 220, and the other of the second input terminals 204 is connected to the base of a transistor 221.

The emitters of the transistors 218 and 219 are connected to a ground terminal 213 through a first common DC current source 222. The emitters of the transistors 220 and 221 are connected to the ground terminal 213 through a second common DC current source 223.

The emitters of transistors 224 and 225 are connected to the collector of the transistor 218, and the emitters of transistors 226 and 227 are connected to the collector of the transistor 219. The emitters of transistors 228 and 229 are connected to the collector of the transistor 220. The emitters of transistors 230 and 231 are connected to the collector of the transistor 221. The bases of the transistors 224, 227, 229, and 230 are connected to a first modulation input terminal 232. The bases of the transistors 225, 226, 228, and 231 are connected to a second modulation input terminal 233. The collectors of the transistors 224 and 228 are connected to a power source terminal 211 through a resistor 234. The collectors of the transistors 227 and 231 are connected to the power source terminal 211 through a resistor 235. The collectors of the transistors 225, 226, 229, and 230 are directly connected to the power source terminal 211.

The collectors of the transistors 224 and 228 are connected to one of differential output terminals 217, and the collectors of the transistors 227 and 231 are connected to the other of the differential output terminals 217.

The first and second DC current sources 222 and 223 have a function for varying a current value. The control terminals of the current sources 222 and 223 are connected to a power control terminal 236. For the sake of descriptive convenience, assume that a control signal from the power control circuit 27 of FIG. 5 is applied to the power control terminal 236, current values of the DC current sources 222 and 223 are controlled to be predetermined values, and the current sources 222 and 223 are operated under this condition.

Inputs from the first and second modulation input terminals 232 and 233 serve as differential inputs. In the following description, assume that the digital modulation signal is converted into a differential signal which is then applied to the modulation input terminals 232 and 233, and that a potential at the first modulation input terminal 232 is sufficiently higher than that at the second modulation input terminal 233 when the digital modulation signal is at logical "0", and a potential of the second modulation input terminal 233 is sufficiently higher than that at the first modulation input terminal 232 when the digital modulation signal is at logical "1".

In the switching circuit (FIG. 7) having the above arrangement, when the digital modulating signal is set at logical "0", i.e., when the potential at the first modulation input terminal 232 is sufficiently higher than that at the second modulation input terminal 233, base potentials at the transistors 225, 226, 228, and 231 are lower than base potentials at the transistors 224, 227, 229, and 230. The transistors 225, 226, 228, and 231 are turned off, and currents do not flow therethrough. For this reason, collector currents of the transistors 218 and 219 flow through the resistors 234 and 235 and the collector-emitter paths of the transistors 224 and 227. Collector currents of the transistors 220 and 221 flow through the collector-emitter paths of the transistors 229 and 230. Therefore, the signal input from the differential input terminals 201 is differentially amplified by the transistors 218 and 219, and the differentially amplified signal is output across the output terminals 217. However, since the collector currents of the transistors 220 and 221 do not flow through the resistors 234 and 235, the signal input from the differential input terminals 204 are not output from the output terminals 217. That is, only the output signal input from the oscillator circuit 23 to the differential input terminals 201 is amplified and appear across the output terminals 217.

When the digital modulating signal is set at logical "1", i.e., when a potential at the second modulation input terminal 233 is sufficiently higher than at the first modulation input terminal 232, base potentials of the transistors 224, 227, 229, and 230 are lower than those of the transistors 225, 226, 228, and 231. The transistors 224, 227, 229, and 230 are turned off, and currents do not flow therethrough. For this reason, the collector currents of the transistors 220 and 221 flow through the resistors 234 and 235 and the collector-emitter paths of the transistors 228 and 231. The collector currents of the transistors 218 and 219 flow through the collector-emitter paths of the transistors 225 and 226. The signal input across the differential input terminals 204 is differentially amplified by the transistors 220 and 221, and the differentially amplified signal is output across the output terminals 217. However, since the collector currents of the transistors 218 and 219 do not flow through the resistors 234 and 235, the signal input from the differential input terminals 201 is not output across the output terminals 217. That is, only the output signal from the oscillator circuit 24 to the differential input terminals 204 is amplified, and the amplified signal is output across the output terminals 217.

As described above, in the switching circuit shown in FIG. 7, when the digital modulating signal is set at logical "0", the signal input across the differential input terminals 201 is amplified and output. However, when the digital modulating signal is set at logical "1", the signal input from the differential input terminals 204 is amplified and output. Since a capacitor and a resistor having a high resistance which increase a time constant are not present in the switching circuit, the switching circuit can be operated at high speed.

Referring to FIG. 7, the transistors 218 and 219 and the transistors 220 and 221 serve as differential amplifiers, respectively. Even if noise is applied between the ground terminal 213 and the power source terminal 211 or between the input terminals 201 and 204, noise can be eliminated and is not output across the differential output terminals 217. In addition, a current flowing from the power source connected between the ground terminal 213 and the power source terminal 211 to the switching circuit consists of a current flowing through he first DC current source 222 and current flowing through the second DC current source 223. That is, the current consists of only the DC current. For this reason, the switching circuit shown in FIG. 7 does not become a noise source for other circuits (e.g., an oscillator circuit) connected to the power source.

In the switching circuit as described above with reference to FIG. 7, all currents flowing from the power source connected between the power source terminal 211 and the ground terminal 213 flow through the DC current sources 222 and 223. The current values of the DC current sources 222 and 223 can be controlled by the signal applied to the power control terminal 236. That is, the current consumption of the entire switching circuit can be controlled by the signal applied to the power control terminal 236. In some cases, the current consumption of the entire circuit can be set to be zero to stop the circuit operation, i.e., the circuit may be set in the standby state. When the current values of the DC current sources 222 and 223 are changed, values of currents flowing through the transistors are changed accordingly, so that the gain of the differential amplifier circuit is also changed. Therefore, the level of the output signal from the output terminals 217 can also be controlled in addition to the current consumption of the entire circuit.

The switching circuit shown in FIG. 7 has a feature of a high switching speed. For example, in the switching circuit shown in FIG. 3, an input signal supposed not to be output may leak to the output terminal or the opposite input terminal by a parasitic capacitance of the collector-base paths of the transistors 202, 203, 205, and 206. However, in the switching circuit shown in FIG. 7, the transistors 224, 227, 228, and 231 are connected between the collectors of the transistors 218, 219, 220, and 221 and the output terminal 217 and between the collectors of the transistors 218 and 219 and the collectors of the transistors 220 and 221. Therefore, even if a parasitic capacitance is present in the collector-base paths of the transistors 218, 219, 220, and 221, the leakage signal has a very small magnitude, and the switching speed can be increased.

An arrangement of the switching circuit 25 of FIG. 5 is exemplified in FIG. 7.

The transmitter shown in FIG. 5 includes the power amplifier circuit 26 and the power control circuit 27 in addition to the oscillator circuits 23 and 24 and the switching circuit 25.

A circuit arrangement may be employed to obtain a sufficient output power from the power amplifier circuit 26. It is preferable to arrange the circuit so as to control the current consumption of the entire circuit and the output signal level. When power conversion efficiency is taken into consideration, it is often more preferable to arrange a single-end circuit than a differential amplifier circuit. In this case, since the oscillator circuits and the switching circuit have a differential amplifier circuit arrangement and are not easily adversely affected by other circuits, the power amplifier circuit need not have a differential amplifier circuit arrangement. In this case, if an output from the switching circuit is a differential output, one of the output terminals is used.

The power control circuit is arranged such that a current flowing from the power source through the power setting resistor connected to the input terminal 28 is converted into a control signal, and this control signal is supplied to the respective circuits. The power control circuit is preferably arranged to change current consumption in accordance with a resistance of the power setting resistor. The power control circuit is arranged to have a function for enabling and disabling the respective circuits connected to the output and the power control circuit itself in accordance with a signal input from the input terminal 29.

An effect of the embodiment shown in FIG. 5 will be described below.

The circuit of FIG. 5 has the same effect as the embodiment of FIG. 1 as far as the FSK modulation function is concerned. In addition, almost all the functions of the circuit (FIG. 5) as the transmitter are incorporated in a single package. Therefore, a compact transmission system can be arranged when a power source, an antenna, its matching circuit, and a power setting resistor are connected to the transmitter. The current consumption and the output signal level can be optimally controlled by the externally connected power setting resistor.

The circuit of FIG. 5 can be enabled or disabled by an external circuit. The current consumption of the entire circuit is set to be almost zero, and the circuit is set in a so-called standby state.

The embodiment shown in FIG. 5 has been described.

The oscillator circuits and the switching circuit used in the present invention are not limited to those shown in FIGS. 2, 3, 6, and 7.

For example, the DC current source 105 and the bias circuit 109 in the oscillator circuit (FIG. 2), and the DC current source 212 and the bias circuit 214 in the switching circuit (FIG. 3) may have a current variable function and a current consumption variable function. Therefore, these oscillator circuit and switching circuit may be used in place of the oscillator circuit and the switching circuit shown in FIG. 5.

Various oscillator circuits shown in U.S. Pat. No. 4,897,621 (Japanese Patent Applicantion No. 63-45666) may be used as the oscillator circuit.

In fine, any oscillator and switching circuits may be used if functions necessary in the present invention can be obtained.

In the embodiment of FIG . 5, the power control function, i.e., the power control circuit 27 may be omitted. In this case, the power consumption control function and the output signal level control function are omitted from other circuits. When a necessary power can be obtained from an output from the switching circuit 25, the power amplifier circuit 26 can be omitted.

In the above-mentioned embodiments and their modifications, the surface acoustic wave resonators are formed on a signal piezoelectric substrate. However, the present invention is not limited to this. A plurality of surface acoustic wave resonators may be formed on a plurality of piezoelectric substrates if their materials are identical.

In the above embodiments and their modifications, the surface acoustic wave resonator is oscillated. However, the oscillator circuit is not limited to this. Oscillation may be performed by using, e.g., a surface acoustic wave filter, a surface acoustic wave delay line, a crystal resonator, a ceramic resonator, or the like. In this case, shapes of electrodes formed on the piezoelectric substrates may be individually designed. In this case, a plurality of resonators may be formed on a single piezoelectric substrate or individual piezoelectric substrates if their materials are identical.

In addition to the oscillator circuits and the switching circuits, other circuits such as an amplifier circuit for amplifying an input/output signal and a circuit for converting an output signal into a digital signal may be formed on the semiconductor integrated circuit substrate.

The present invention has been described with reference to the particular embodiments and their modification. The present invention is not limited to these. Various changes and modifications may be made within the spirit and scope of the invention.

What is claimed is:

1. A modulator comprising:
   a plurality of surface acoustic wave devices;
   a plurality of oscillator circuits, each having a differential circuit arranged in a one-to-one correspondence with said plurality of surface acoustic wave devices, each of said differential circuits generating different frequency signals in correspondence with corresponding surface acoustic wave devices; and
   a switching circuit for selecting a predetermined frequency signal from the plurality of different frequency signals on the basis of a value of a digital signal to be modulated, and for outputting the selected frequency signal as a modulation signal.

2. A modulator according to claim 1, wherein each of said plurality of surface acoustic wave devices includes a single piezoelectric substrate and a plurality of electrode elements deposited on said piezoelectric substrate, and said plurality of oscillator circuits and said switching circuit are formed on a single substrate different from said piezoelectric substrate.

3. A modulator according to claim 1, wherein said oscillator circuit comprises a pair of transistors, the collectors of said transistors being connected to a power source through resistors, the emitters of said transistors being grounded through a common constant current source, and the base and collector of one of said transistors being connected to one of said surface acoustic wave devices.

4. A modulator according to claim 1, wherein said surface acoustic wave devices have two ports, and said oscillator circuit comprises a pair of transistors, the collectors of said transistors being connected to a power source through resistors, the emitters of said transistors being grounded through a common constant current source, and one port of each of said surface acoustic wave devices being connected to the bases of said transistors, and the other port of each of said surface acoustic wave devices being connected to the collectors of said transistors.

5. A transmitter comprising:
   a plurality of surface acoustic wave devices;
   a plurality of oscillator circuits, each having a differential circuit arranged in a one-to-one correspondence with said plurality of surface acoustic wave devices, each of said differential circuits generating different frequency signals in correspondence with corresponding surface acoustic wave devices;
   a switching circuit for selecting a predetermined frequency signal from the plurality of different frequency signals on the basis of a value of a digital signal to be modulated, and for outputting the selected frequency signal as a modulation signal; and
   a power amplifier circuit for amplifying an output signal from said switching circuit.

6. A transmitter according to claim 5, wherein each of said plurality of surface acoustic wave devices includes a single piezoelectric substrate and a plurality of electrode elements deposited on aid piezoelectric substrate, and said plurality of oscillator circuits and said switching circuit being formed on a single substrate different from said piezoelectric substrate.

7. A transmitter according to claim 5, further comprising a power control circuit for controlling operations of said plurality of oscillator circuits, said switching circuit and said power amplifier circuit in accordance with an input signal.

8. A transmitter according to claim 7, wherein said power control circuit controls power consumption of said oscillator circuit, said switching circuit and said power amplifier circuit to be substantially zero.

* * * * *

UNITED STATES PATENT AND TRADEMARK OFFICE
CERTIFICATE OF CORRECTION

PATENT NO.   : 5,016,260
DATED        : May 14, 1991
INVENTOR(S)  : Youichi MASIDA It is certified that error appears in the above-identified patent and that said Letters Patent is hereby corrected as shown below:

```
Claim 6, column 18, line 54, change "aid" to --said--.
```

Signed and Sealed this

Twenty-fifth Day of May, 1993

Attest:

MICHAEL K. KIRK

Attesting Officer

Acting Commissioner of Patents and Trademarks